United States Patent
Verma

(10) Patent No.: US 9,812,180 B2
(45) Date of Patent: Nov. 7, 2017

(54) PROGRAMMABLE LOGIC ACCELERATOR IN SYSTEM ON CHIP

(71) Applicant: Hare Krishna Verma, Fremont, CA (US)

(72) Inventor: Hare Krishna Verma, Fremont, CA (US)

( * ) Notice: Subject to any disclaimer, the term of this patent is extended or adjusted under 35 U.S.C. 154(b) by 0 days.

(21) Appl. No.: 14/997,595

(22) Filed: Jan. 18, 2016

(65) Prior Publication Data

US 2017/0206939 A1 Jul. 20, 2017

(51) Int. Cl.
G11C 7/10 (2006.01)
G11C 5/06 (2006.01)

(52) U.S. Cl.
CPC . *G11C 7/10* (2013.01); *G11C 5/06* (2013.01)

(58) Field of Classification Search
None
See application file for complete search history.

(56) References Cited

U.S. PATENT DOCUMENTS

| 8,103,919 B1* | 1/2012 | Kumar | G11C 29/785 714/711 |
| 2007/0153576 A1* | 7/2007 | Oh | G11C 7/1021 365/185.11 |
| 2015/0326215 A1* | 11/2015 | Snook | H02J 13/0062 327/427 |

* cited by examiner

Primary Examiner — Harry W Byrne
Assistant Examiner — Sultana Begum
(74) Attorney, Agent, or Firm — Dentons US LLP; Peter Su

(57) ABSTRACT

A programmable logic array (PLA) is disclosed employing programming logic tile (PLT), System On Chip (SOC) interface bus, Input Output (IO) blocks and Logic Processing Blocks (LPB). SOC processors using SOC interface bus program PLT successively using different configuration memory bank values to realize a logic not limited by the PLT resource counts. Configuration memory blocks comprising of multiple configuration memory banks and configuration programming control logic remove logic processing penalty due to configuration delays. PLT comprises of Programmable Logic Cells (PLC), Programmable Logic Interface (PLY), Embedded Array Blocks (EAB) and configuration memory block. PLA comprises of PLT, IO blocks, SOC interface bus and LPB. PLA accelerates user functionality in as SOC. IO blocks are used to stream data from other SOC components. LPB use PLT to accelerate user specific functionality.

5 Claims, 15 Drawing Sheets

500 PLC, PLY, EAB, Configuration Memory Banks

300 Programmable Logic Accelerator with Logic Block Acceleration

350 An example Programmable Logic Accelerator Usage

900 Programmable Logic Accelerator code compiler

1100 Memory space and management

PROGRAMMABLE LOGIC ACCELERATOR IN SYSTEM ON CHIP

BACKGROUND OF THE INVENTION

Field of Invention

The present invention relates generally to Integrated Circuits (ICs), such as System on Chips (SOC) with on chip processors, and more particularly with programmable logic accelerators embedded or coupled with SOC.

Description of Related Art

Systems on Chips (SOC) are often selected by design engineers to provide flexible and powerful solutions for many applications. Processors can run user software and provide required flexibility. Dedicated logic accelerator blocks implement SOC application logic using Application Specific Integrated Circuit (ASIC) technology. These dedicated accelerator blocks provide high performance required by the application, which a software solution cannot provide. Input and Outputs (IO) to the SOC are handled by special IO blocks. Conventional SOCs are implemented using multiple processors, memory, logic and IO blocks that interact with each other using SOC interface buses. Operating System (OS) software running on processors manage and coordinate the functionality of the SOC. OS also runs and control application software.

In another conventional structure, logic can also be made programmable by using Field Programmable Gate Arrays (FPGA) in an SOC solution. FPGAs are built using Configurable Logic Blocks (CLB) that can be programmed to implement required logic functionality. FPGAs provide more performance than processors and can be used where user needs logic configurability. FPGAs are more expensive than ASIC design blocks. At the cost of area and power, FPGAs provide more flexibility than ASIC design blocks. In these conventional structures, FPGA cannot implement larger logic blocks that require more logic than present in selected FPGA. In many cases, FPGAs are not integrated with SOC architecture to use OS in an efficient way.

Accordingly, it is desirable to have a Programmable Logic Accelerator (PLA) that provides the required flexibility and performance. The resources available do not limit the implementation on PLA. PLA integrates natively with OS to utilize the memory and resource management infrastructures of SOC.

SUMMARY OF THE INVENTION

The present invention describes a Programmable Logic Accelerator (PLA) employing Programmable Logic Tiles (PLT) within a System on Chip (SOC) chip integrated using SOC interface bus, IO blocks and Logic Processing Block (LPB). SOC interface bus interconnects PLA with SOC central processing unit processors and other SOC components. PLA connects directly with other SOC components using IO blocks. LPB use PLT to accelerate application specific logic functionality. LPB interacts with SOC using SOC interface bus or directly to other SOC components.

PLT comprises of Programmable Logic Cells (PLC), programmable logic interface (PLY), Embedded Array Blocks (EAB) and configuration memory block. PLC implement user defined logic functionality. The memory or compute structures of EAB provide application specific logic blocks embedded in PLT. PLY blocks are the edges of PLT. PLY interacts with SOC interface bus, IO blocks and LPBs. PLC, EAB and PLY are connected using hierarchical lines. A multiplexer based switching structure selects between different lines providing for multitudes of connections. The adjacent connection of the switching structure enables tiling for a user defined PLT array size. In addition, EAB are also connected using a switching structure that can be tiled.

Configuration memory block comprises of one or more configuration memory banks. The configuration memory control logic configures the logic and switching structures of PLA. The configuration block is designed for high performance using ASIC techniques. In one embodiment, there are two configuration memory banks in a configuration logic block. While logic in PLT is processed using the first memory bank, the second memory bank is programmed by configuration program control logic. While logic in PLT is processed using the second memory bank, the first memory bank is programmed by configuration program control logic. The configuration program control logic switches between these two banks. Using this mode, logic processing in PLA is not blocked due to configuration. This enables high performance logic processing using SOC interface bus and OS. The configuration logic block enables a way to use PLA for different user logic implementation without any configuration load penalty.

PLA accesses the memory space defined and allocated by OS. OS can transfer or share data from PLA memory space to other software programs and SOC components. PLA integration provides a seamless use of SOC software stack. In an alternative embodiment, PLA streams data between different SOC components. In this mode, SOC components do not need to access data from OS memory space to use PLA resources.

Broadly stated, Claim 1 recites a configuration memory block with plurality of configuration memory banks, which can be controlled to avoid configuration load penalty. Different embodiments of PLT and PLA using configuration memory blocks are claimed. The methods to design and execute user code on PLA using SOC processor schemes are present in the invention.

Advantageously, the present invention addresses the shortcomings of user programming of logic structures in SOC structures using programmable logic accelerators. The present invention removes the configuration load penalty from logic operations enabling multiple usages of PLA resources for one user design. Other structures and methods are disclosed in the detailed description below.

This summary does not purport to define the invention. The invention is defined by the claims. These and other embodiments, features, aspects, and advantages of the invention will become better understood with regard to the following description, appended claims and accompanying drawings.

Reference symbols or names are used in the Figures to indicate certain components, aspects or features therein, with reference symbols common to more than one Figure indicating like components, aspects or features shown therein.

DETAILED DESCRIPTION OF PREFERRED EMBODIMENTS

Figure 1:
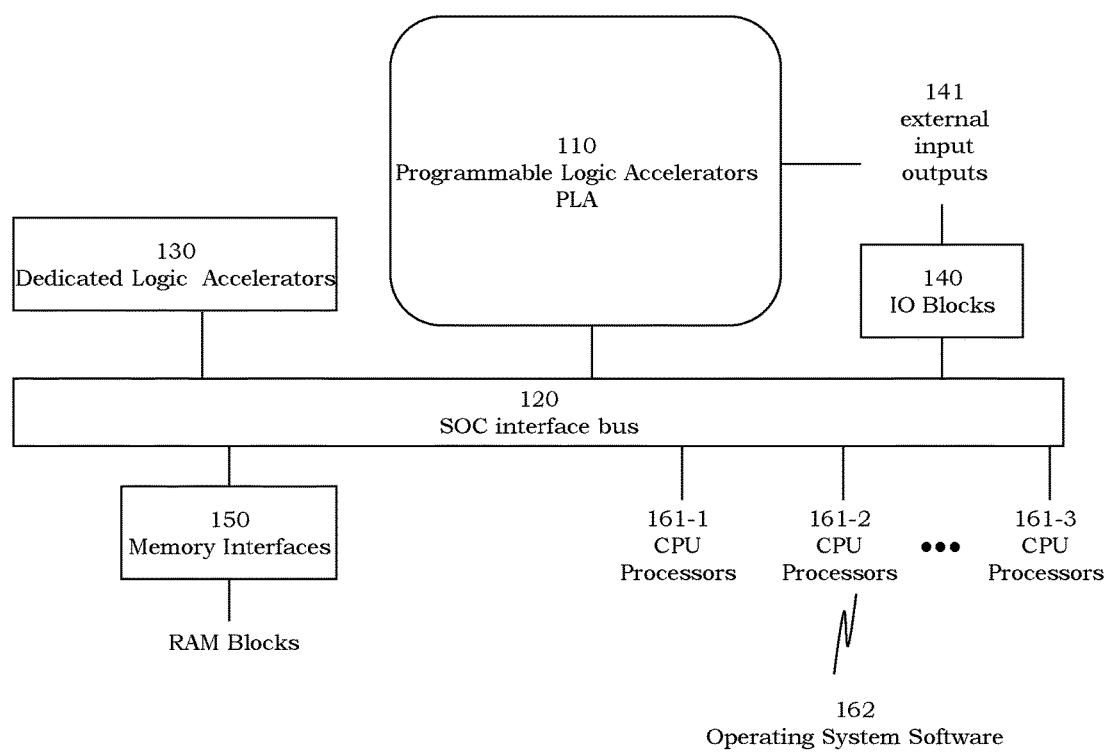
FIG. 1 is an architectural diagram illustrating PLA with processors, system interface bus, memory and IO blocks in accordance with the present invention.

Referring now to FIG. 1, there is shown an architectural diagram illustrating a PLA 110 in a SOC architecture. It illustrates a conventional SOCs implemented using one or more central processing unit processors 161-1 through 161-3, memory interface 150 and IO blocks 140 that interact with each other using SOC interface bus 120. SOC interface bus 120 connects programmable logic accelerators 110 with other SOC components. External IO interface 141 can transmit and receive data to SOC 100 using IO blocks 140. IO blocks 140 can also transmit and receive data directly with PLA block 110. One or more dedicated logic accelerator block 130 is connected to system interface bus 120. Programmable SOC 100 provides a flexible and powerful solution for many applications. Processors 161 can run user software and provide required flexibility. Dedicated logic accelerator block 130 uses ASIC technology for high performance required for the target application area. PLA 110 provides high performance to meet the target application area requirements. In addition, the logic of PLA 110 can be customized for application logic. PLA 110 provides flexibility of a processor 161 solution with the performance of dedicated logic accelerator blocks 130. OS software 162 running on processors 161 manage and coordinate the functionality and application software of the SOC 100.

Figure 2:
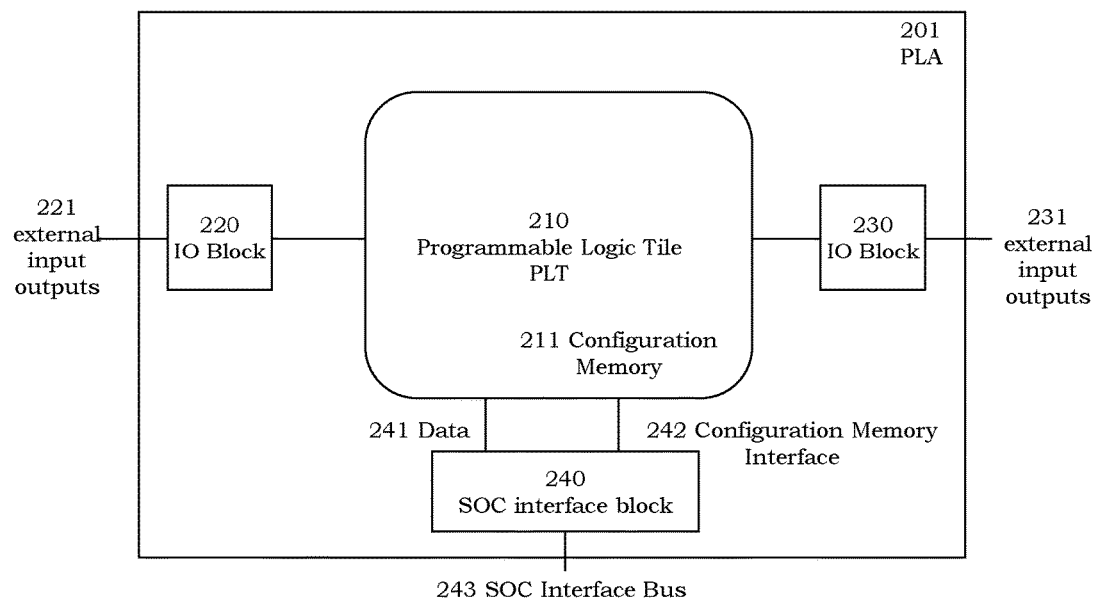
FIG. 2 illustrates a PLA architecture diagram in accordance with the present invention. PLA 201 is built by connecting PLT 210 with IO blocks 220 and 230, and SOC interface blocks 240. IO interface 231 and 221 transmit and receive data into PLT 210.

In FIG. 2, there is shown an architecture diagram illustrating an embodiment of a PLA 200 in a direct connection to IO block 220. SOC interface block 240 interacts with SOC interface bus 243 delivering data addressed to PLA 200. PLA 200 comprises of one or more IO blocks 220 and 230, one or more PLT 210, and SOC interface block 240. SOC interface block 240 reads the instructions to identify between data 241 bus command and configuration memory interface 242 bus command. Data 241 interact with PLT 210 data interface blocks. Configuration memory interface 242 interacts with the configuration memory 211 of PLT 210. Said PLT 210 has one or more banks in configuration memory 211, which interact with configuration memory interface 242. OS software 162 running on the SOC processor can read and write into said PLT 210 configuration memory 211 through SOC interface bus 240 and configuration memory interface 242. The OS software 162 can also read and write data through SOC interface bus 240 and data 241 interface.

Figure 2A:
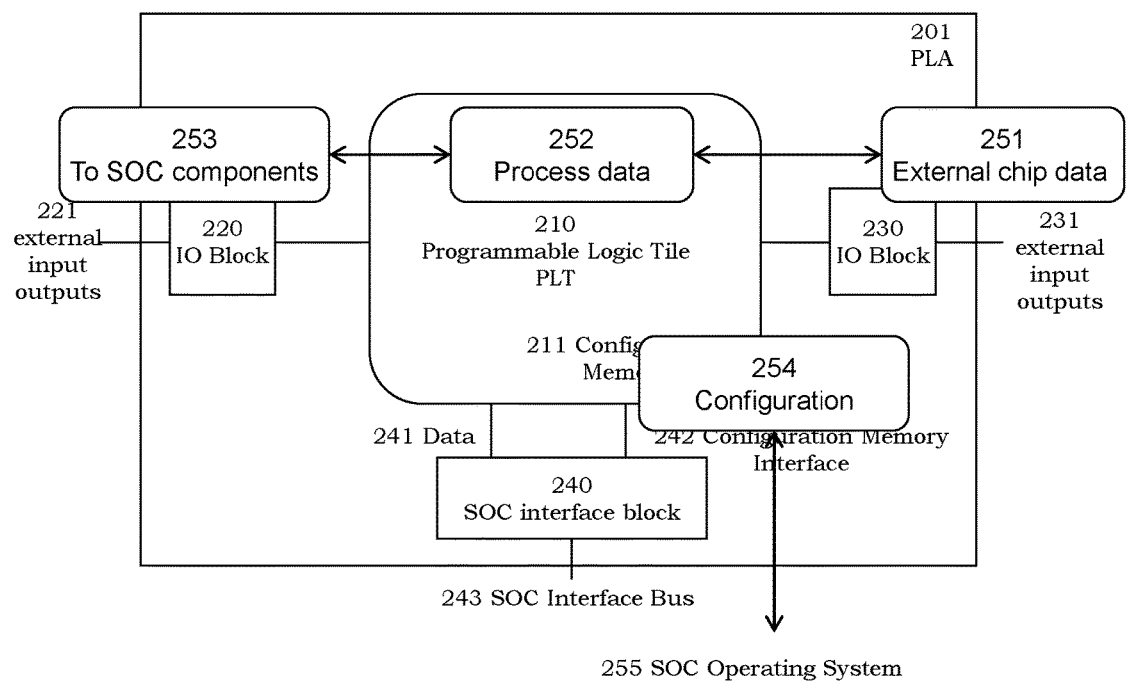
FIG. 2a further illustrates a data flow between SOC components and external IO interfaces.

FIG. 2a shows an example embodiment 250 illustrating a use of PLA 200. External chip data 251 is transmitted and received by PLT 210. PLT 210 can process data 252. PLT 210 transmits and receives data to other SOC components 253. PLT provides a bridge with application processing capabilities in the SOC. SOC OS 254 can in parallel provide configurations 254 through the SOC interface block 240. Configuration banks and logic provide the performance and capability to not deteriorate the data flow performance achieved through the processing data 252 logic. Furthermore, it is achieved by high performance configuration logic and one or more configuration memory banks.

Figure 3:
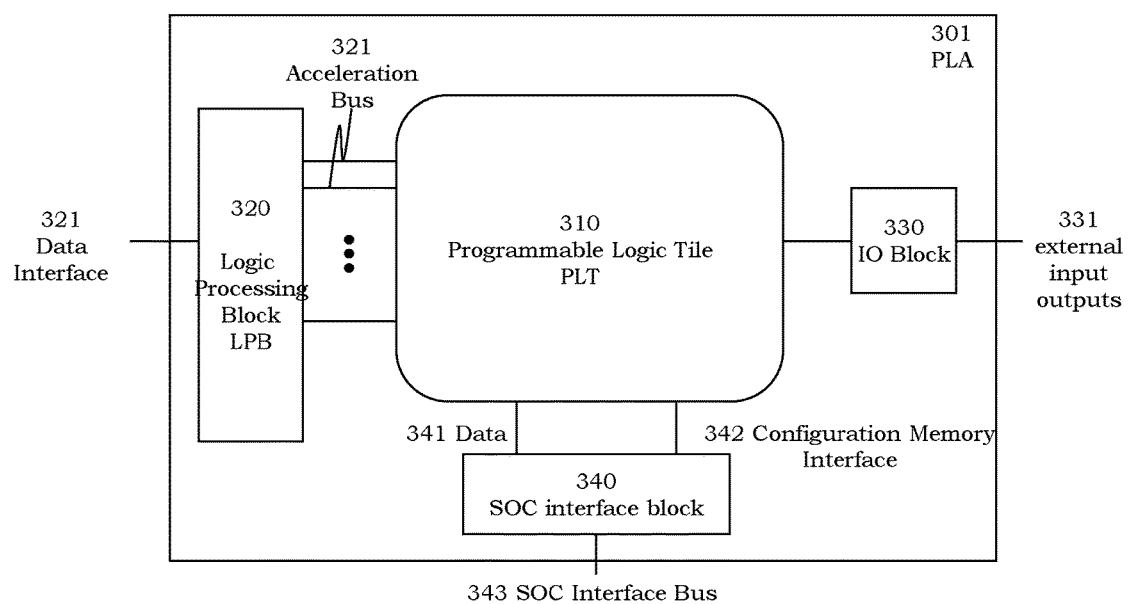
FIG. 3 illustrates an alternative PLA architectural diagram. PLA 301 is built by connecting PLT 310 with IO blocks 330, SOC interface blocks 340 and block processing logic 320.

FIG. 3 illustrates an architectural diagram of an alternative embodiment of a PLA. PLA 300 comprises of PLT 310, SOC interface block 340 and IO blocks 330. IO blocks 330 and SOC interface blocks function similarly to the previous embodiment illustrated in FIGS. 2 and 2a. A LPB 320 uses PLT 310 to accelerate functions using the acceleration bus 321. LPB 320 interacts with external data interface block 321. LPB 320 can parse data and use acceleration bus 321 to accelerate customized functions using PLT 310.

Figure 3A:
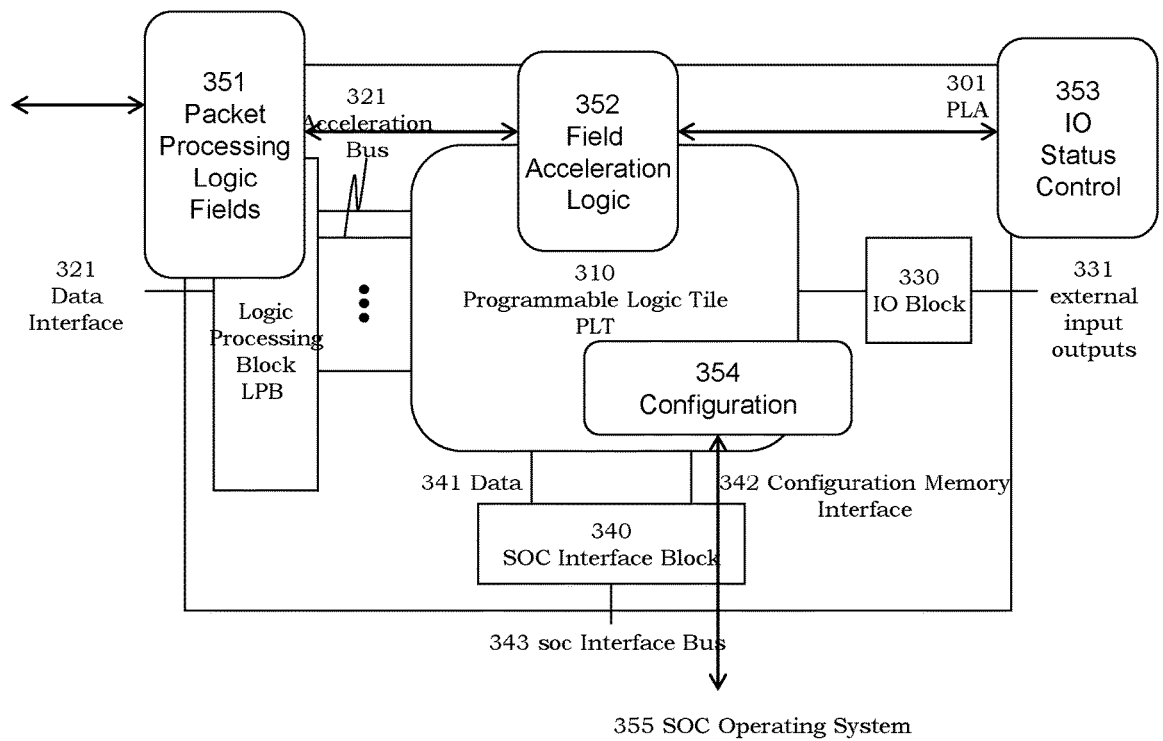
FIG. 3a further illustrates data flow between packet processing logic, PLT and IO blocks.

FIG. 3a shows an example embodiment 350 of use of PLA 300. As an example, the packet chip data 351 is transmitted and received by block 351. Block 351 can parse packet and extract its different fields. The different fields need acceleration functions, which are implemented in PLT 310. Field acceleration logic 352 is implemented in PLT 310. Furthermore, data is transmitted between packet processing block 351 and acceleration logic 352 using an acceleration bus 321. IO block 353 is used for status and control signals from PLT 310. PLT 351 provides acceleration logic with application processing capabilities in SOC. SOC OS 354 in parallel provides configurations 354 through the SOC interface block 340. Configuration banks and logic provide the performance and capability to not deteriorate the data flow performance achieved through the acceleration logic 352. Furthermore, it is achieved by high performance configuration logic and one or more configuration memory banks.

One of ordinary skill in the art should recognize that FIG. 2 and FIG. 3 are intended as embodiments such that other variations or modifications can be practiced without departing from the spirits of the present invention, e.g. a different number of IO blocks, SOC processors or LPBs.

Figure 4:
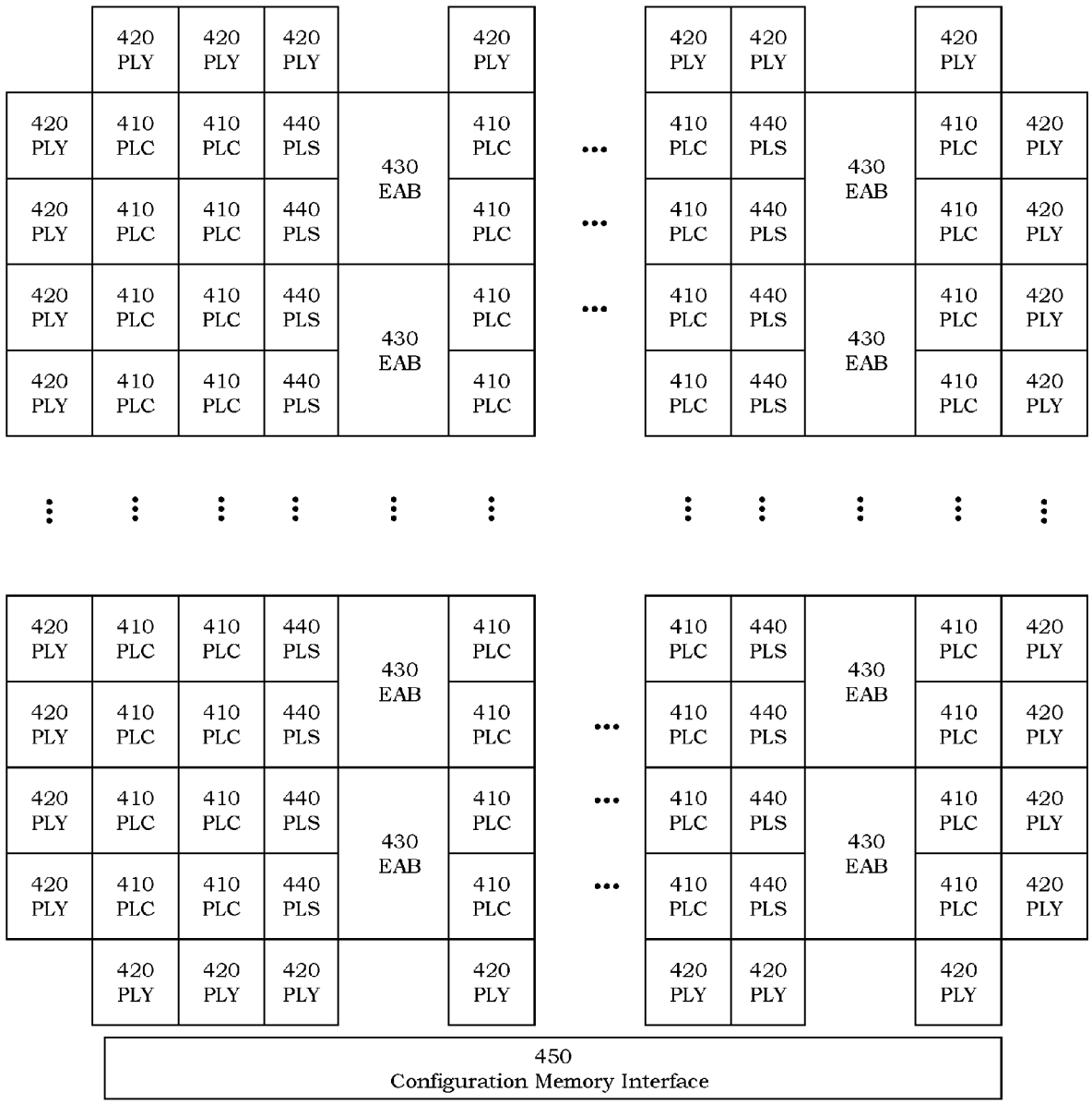
FIG. 4 is a block diagram illustrating PLT. PLT is a configurable tile structure consisting of Programmable logic switch (PLS) 440, PLC 410, PLY 420, EAB 430 and configuration interface 450.

FIG. 4 illustrates a block diagram of PLT 400. PLT 400 is a configurable tile structure consisting of PLS 440, PLC 410, PLY 420, EAB 430 and configuration interface 450. For an application, PLT is constructed for a required number of PLC, EAB and PLY. These structures are tiled to create a PLT for the given application. The number of PLC 410 can be configured between horizontal and vertical directions for a given dimension. In a particular embodiment, PLC 410 numbers can be chosen to be a number greater than one along vertical or horizontal directions for a PLT 400. PLY 420 receives and transmits data to PLC 410 structures. PLY 420 forms the edges of PLT 400. It resides on north, south, east or west edges of PLT. Configuration memory interface 450 receives data from an SOC interface block 340 to read and write into the configuration memory of PLT. A PLT 400 embeds vertical structures of EAB 430. EAB 430 is connected to PLC 410 using a PLS 440. PLS 440 connects with PLS inside PLC 410 block. Furthermore, configuration interface 450 is used by SOC to program the functionality of PLS, PLY, and EAB.

Figure 5:
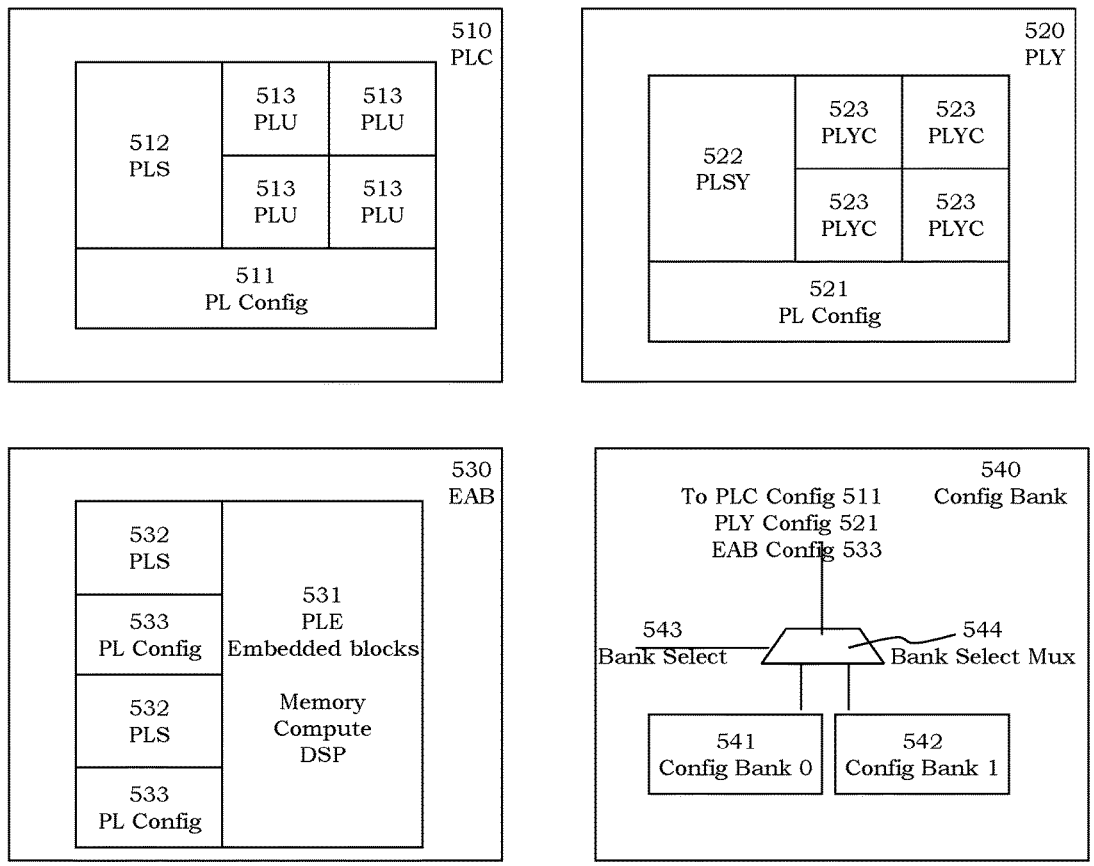
FIG. 5 has block diagrams for PLC 510, PLY 520, EAB 530 and configuration bank 540.

FIG. 5 has block diagrams for PLC 510, PLY 520, EAB 530 and configuration memory bank 540. PLC 510 includes PLS 512, PLU 513 and programmable logic configuration 511. PLS 512 connects with other PLSs in the PLT structure. It is further explained in FIG. 6 logic structures of PLU 531 can be programmed for a given application user design. Programmable logic configuration 511 blocks has one, or two, or more configuration memory banks. Configuration memory 511 is a part of PLT configuration memory. PLC 510 can be tiled for a given horizontal and vertical number to create a PLT structure. PLY 520 consists of PLY switch (PLSY) 522, PLY Cell PLYC 523 and programmable logic configuration 521. PLSY 522 interacts and connects with other PLS blocks. PLSY 522 gets data using connection lines to send it to external blocks, or wrap it around to send it back to the internal blocks of the PLT. Programmable logic interface cell (PLYC) 523 has registers and logic providing an interface to an external block. PLSY configuration memory 524 has one, or two, or more configuration memory banks. PLY configuration memory 524 is a part of the configuration memory banks of PLT. EAB includes PLS 532, programmable logic configuration 533 and Programmable Logic Embedded (PLE) 531. PLS 532 connects with the switches of PLC switch 512 and PLY switch 522. EAB and programmable logic configuration memory are part of PLR configuration memory banks. PLE 531 has compute and memory structures to meet the application requirements.

Furthermore, in FIG. 5, configuration memory bank 540 includes one, or two, or more configuration memory banks. The configuration memory blocks from PLC configuration memory 512, PLY configuration memory 522 and EAB configuration memory 521 are consolidated to create a unified configuration memory banks. The configuration bank 540 includes one, or two, or more consolidated configuration memory banks. In this particular embodiment of configuration banks 540, there are two configuration memory banks bank-0 541 and bank-1 542. Furthermore, configuration bank 540 includes bank select lines 543 that can select between bank-0 541 and bank-1 542 using a bank select multiplexer structure 544. In all the embodiments of PLT, configuration memory structures 540 are used to provide configurations for programmable logic array configurations. Furthermore, Configuration memory is designed for a high performance operation. The performance is similar or better than the performance of the data processing logic of the PLT. OS software can switch between two banks of configuration memory to avoid any configuration penalty. Data processing in PLT is not impacted by the configuration memory load and reloads using this mechanism. It is further explained in FIG. 8 and FIG. 9

Figure 5A:
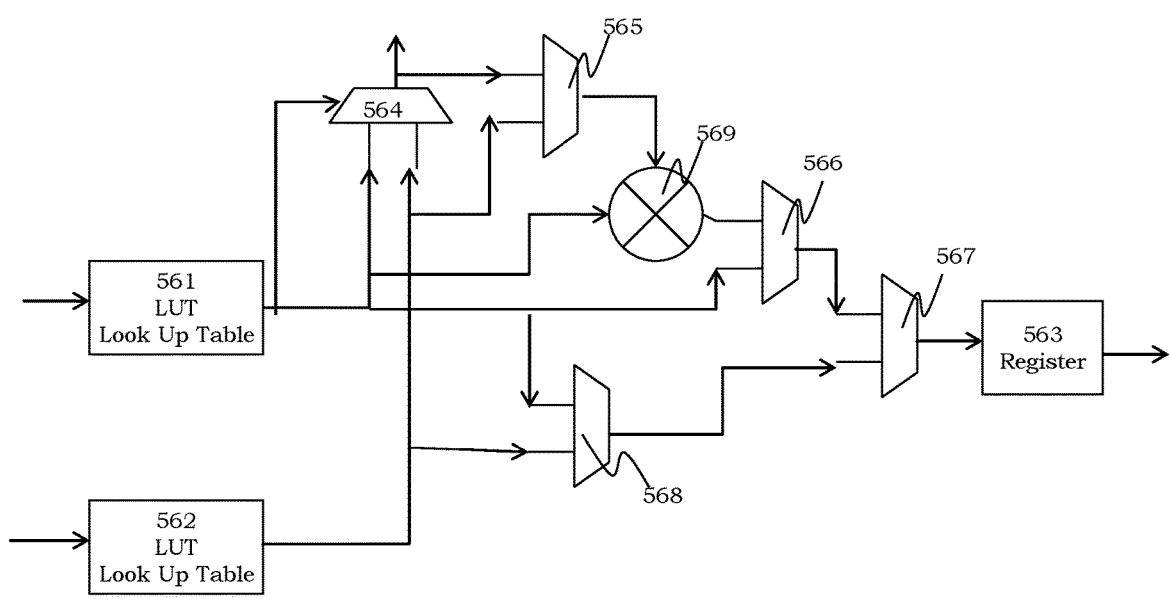
FIG. 5a illustrates a block diagram for a programmable logic unit (PLU) to implement logic functionality.

FIG. 5a illustrates a block diagram of PLU. PLU receives inputs to Look Up Tables LUT 561 and 562. LUT can be programmed to perform any digital function. LUT 561 and LUT 562 feed into an arithmetic multiplexer 564. The output of multiplexer 564 or LUT 561 is connected to an exclusive or function 569. The other input to exclusive or 569 come from LUT 561. PLU is used for implementing logic and arithmetic functions. Multiplexer 566 can select from outputs of exclusive or 569 and LUT 561. Another multiplexer selects between LUT 562 output and LUT 561 outputs. Multiplexer 567 can select between multiplexer 566 and multiplexer 568. Output of multiplexer 567 goes to a register 563. Register 563 is implemented to store values. PLU 560 is programmed by the configuration memory bank to implement logic and memory functionalities. Structures similar to 560 are present in different components of PLA including PLY and EAB.

Figure 6:
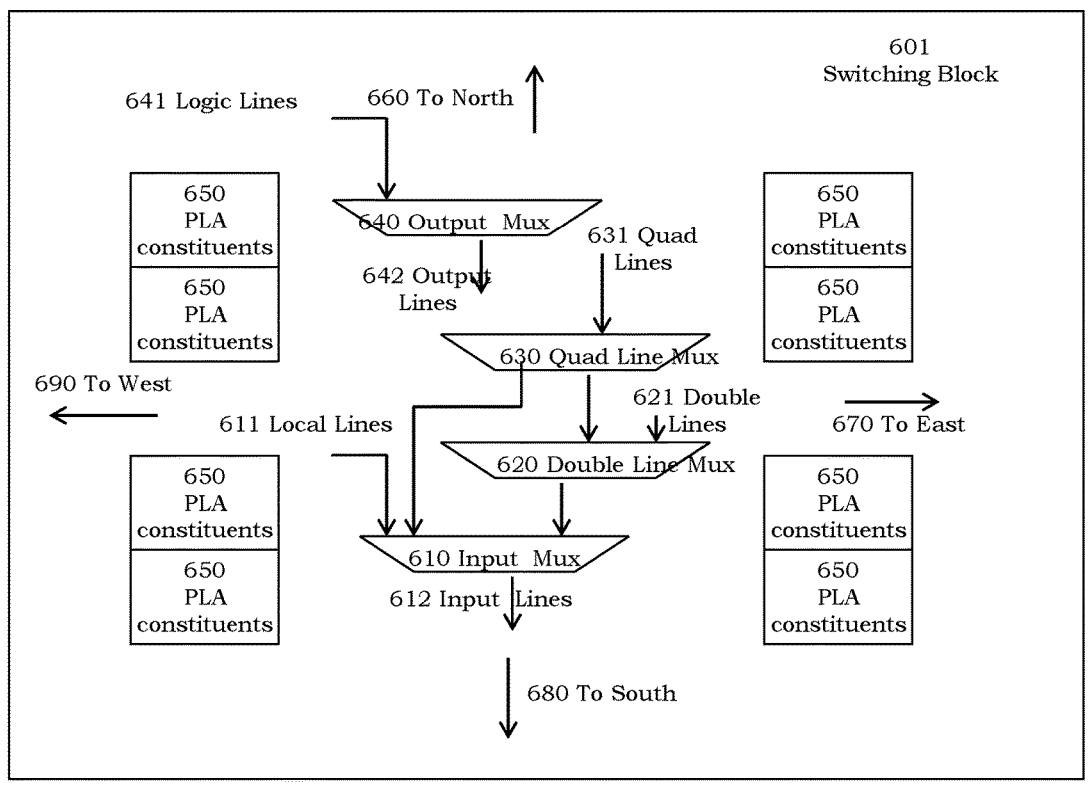
FIG. 6 is an architecture diagram illustrating the connections between different PLA constituents. Different lines include Quad 631, Double 621 and Local 640. These lines are appropriately selected using multiplexers based switch connections.

FIG. 6 illustrates an architecture diagram of PLS lines. Programmable logic architecture components 650 can be PLS 512, PLSY 522 or EAB switch 532. In a given switching line and switch block 601 there can be one or more of the programmable logic architecture components. Input multiplexer 610 provide input to the logic of the PLA constituents 650. Output multiplexers 640 selects from outputs of PLA constituents 650. Over the switch components, lines run that connect to neighbors are local lines 640. Double lines 621 span over two of the switching block 601 structures. Quad lines span over four of the switching block structures. These vertical or horizontal lines can run in east, west, north or south direction. Each switching block 601 starts one or more of the switch lines and terminates one or more of the switch lines. In this scheme, it provides a segmented routing architecture used to route user design signals. Switching blocks have select multiplexers that can select from the connected lines. Quad line mux 630 selects between quad lines and one or more of double, local, input and output lines. Double line mux 620 selects between double lines and one or more of quad, local, input and output lines. Input line mux 620 selects between double, local lines and one or more of quad lines. The general switching structure provides a powerful structure for routing user signals. Furthermore, the multiplexer selection is controlled by the configuration memory bank values.

Figure 7:
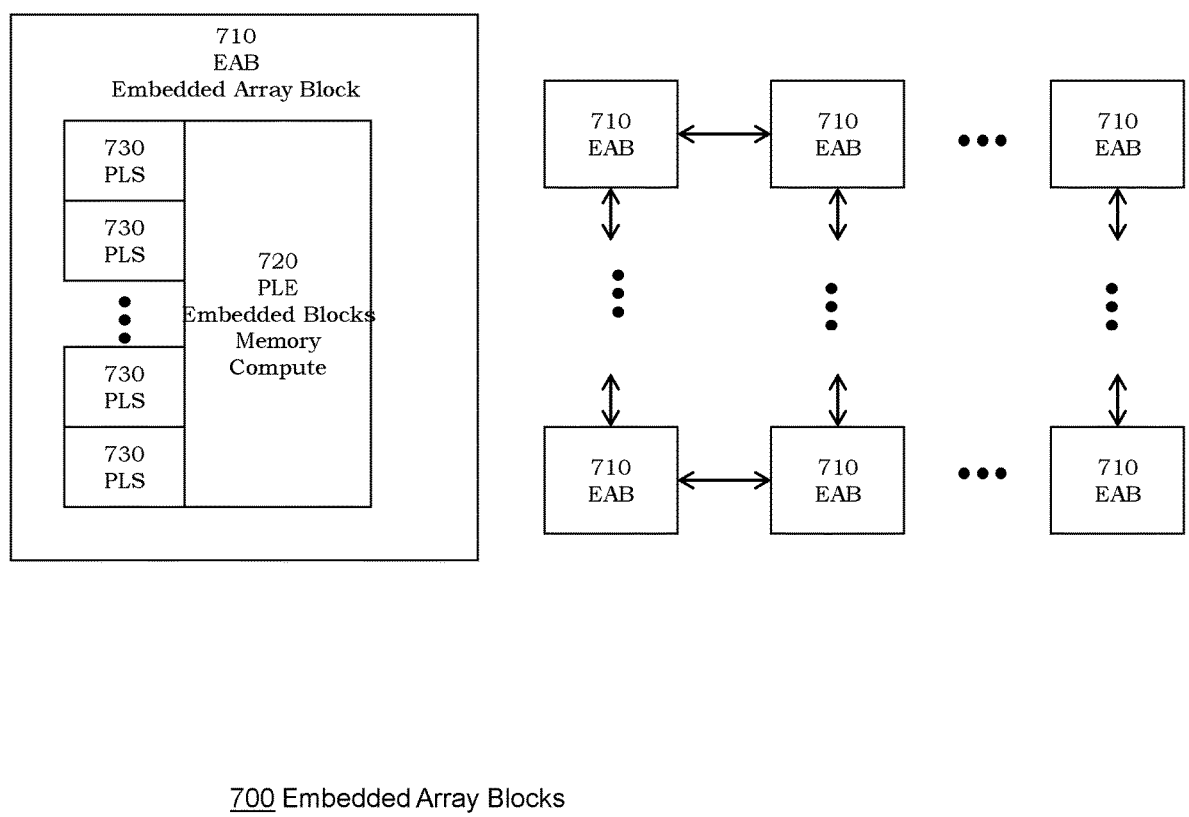
FIG. 7 is a block diagram illustrating EAB and connections between them.

FIG. 7 illustrates an addition to the switching block shown in FIG. 6. PLE blocks 710 can have additional lines connecting them in east, north, west or south blocks. These connections can create a logical structure of embedded blocks. PLE blocks connected through switching structures provide user design specific connections. PLE blocks can implement user required logic and memory functionality. It can be Random Access Memory (RAM) to store data values. It can be a compute block that performs the application specific computations.

Figure 8:
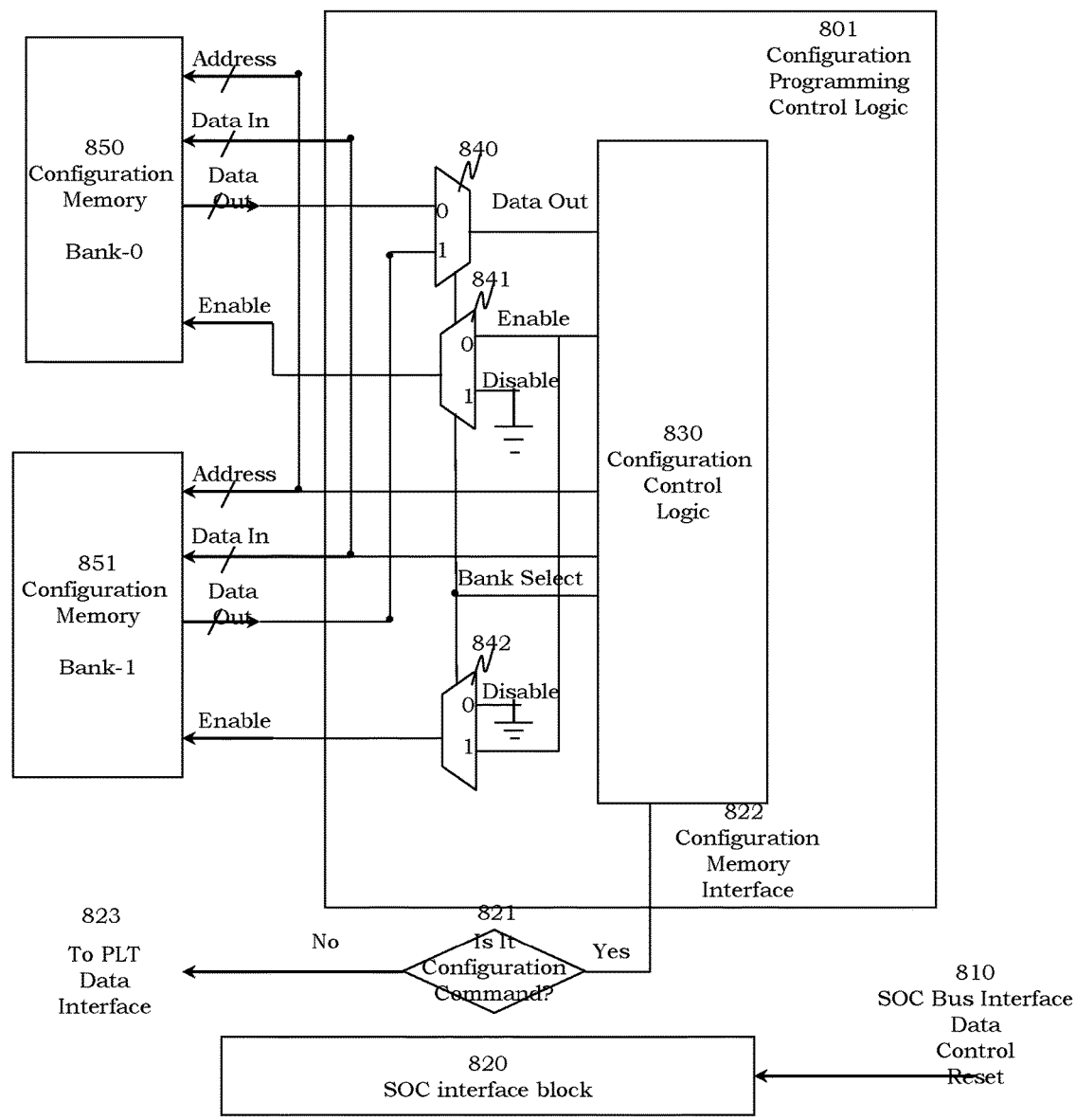
FIG. 8 is a logic diagram for configuration memory block illustrating configuration banks and the selection logic to load configuration memory. It illustrates logic to select and program configuration blocks.

FIG. 8 illustrates a logic diagram of configuration memory scheme. Configuration memory Bank-0 850 and Bank-1 851 are two consolidated configuration memory banks. Memory bits are RAM bits that can be modified by SOC processors. The configuration block control logic and routing in all programmable logic array components. Furthermore, the logic functionality of a given Programmable logic array can be changed by writing into configuration memory block and selecting the Bank Select line 543 as shown in FIG. 5 configuration memory blocks 850 and 851 can write data into a given address when enabled for write operation. Configuration memory blocks send data read from the given address when enabled for read. The configuration memory control logic 830 provides a bank select signal to select between Bank-0 850 and Bank-1 851. Multiplexers 840 selects for a data output. Multiplexer 841 provides the selected enable inputs to Bank-0. If Bank-1 851 is selected, enable for Bank-0 850 is disabled. Multiplexer 842 provides the selected enable inputs to Bank-1 851. If Bank-0 850 is selected, enable for Bank-1 851 is disabled. By using bank select line, configuration control block 830 can read and write into the selected configuration memory bank. The configuration memory control block 830 gets memory data to be written from SOC configuration bus interface 822. When data is present on the SOC interface bus 820, if the interface command is configuration, data is enabled and passed on to configuration memory interface 822. If it is a data command, interface data is processed and passed to PLT data interface 823. SOC interface bus 810 consists of data, control and reset signals. Using these interface pins, processor can write or read from the selected configuration memory bank. It can also send and receive processed data from the PLT blocks. SOC interface block 820 provides interface to the SOC interface bus.

Figure 9:
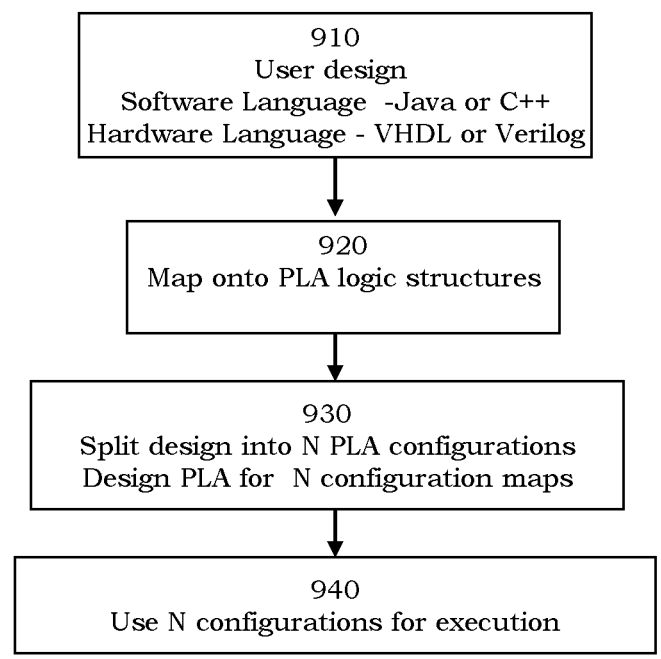
FIG. 9 is a flow diagram illustrating the process for compiling a PLA code with the present invention.

FIG. 9 illustrates a method to map user design into PLA blocks. User can design in a software language such as Java or C++ or in a hardware language such as VHDL or Verilog. User describes application program using these languages. Block 920 illustrates a method to modify and map user design onto PLA constituent logic structures. The given design is now split into multiple PLA blocks if the number of required resources is more than present in the given PLA in SOC. Block 920 splits user designs into N parts, where N is more than or equal to 1. Each split design is mapped into a configuration memory bank value. PLA code compiler maps given user design into N configurations. User design is mapped into N configuration memory bank values after step 940 is completed. These N configurations are then loaded into the PLA by SOC software in a rolling way to realize the user functionality.

Figure 10:
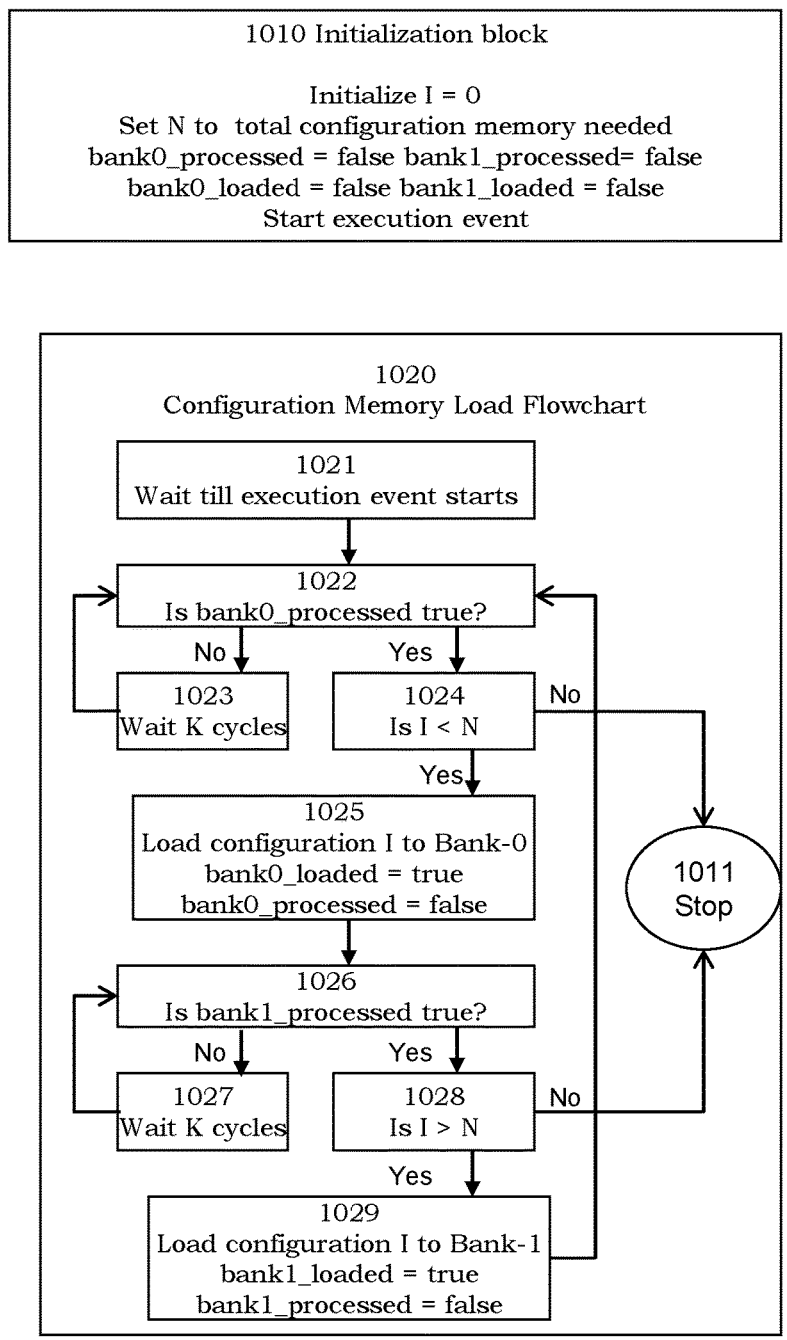
FIG. 10 is a flow diagram illustrating the process for executing PLA code in an SOC with the present invention.
Figure 10A:
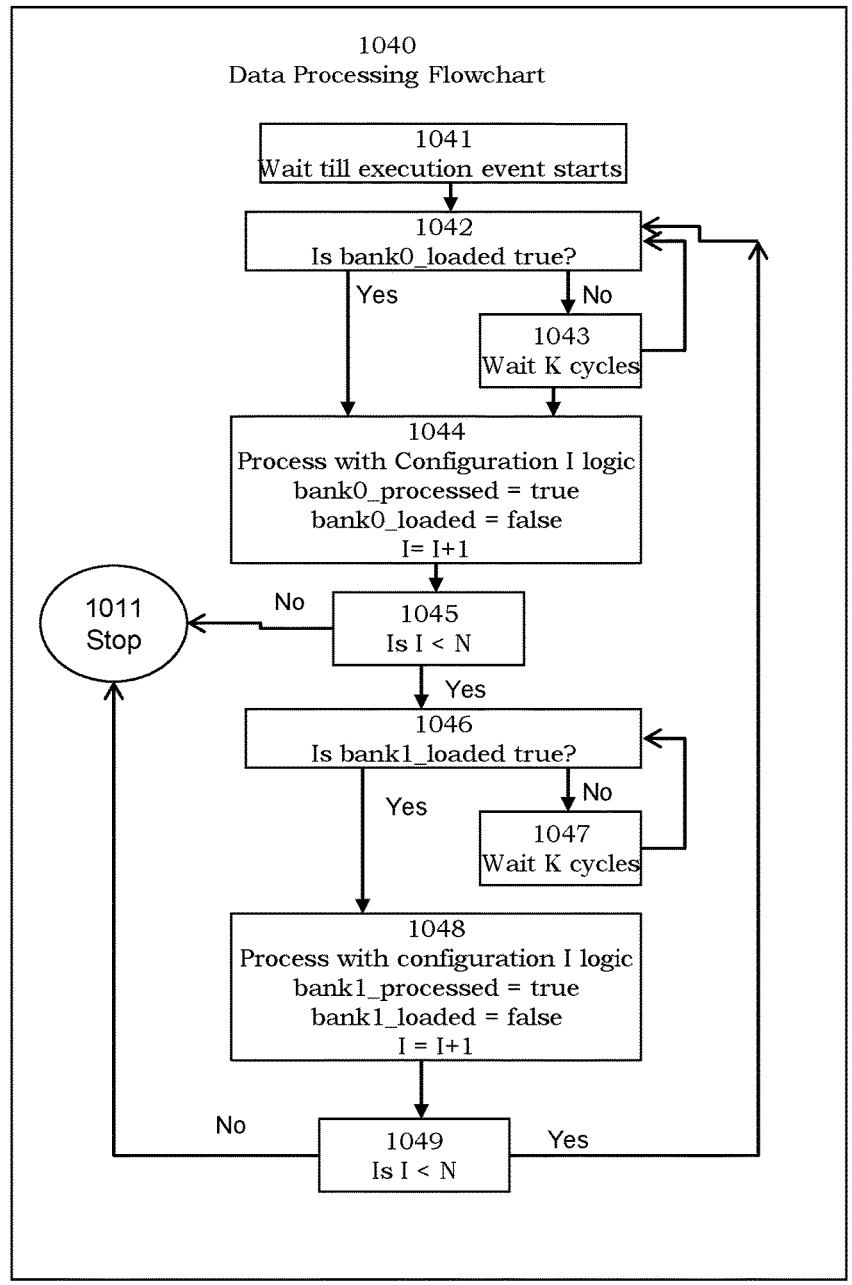
FIG. 10a is a continuation for flow diagram FIG. 10 illustrating the process for executing PLA code.

FIG. 10 and FIG. 10*a* illustrate a method for executing N configuration maps on PLA. In the initialization block 1010, variable I keep track of the configuration memory number to be executed. Variable I is initialized to 0. There are a total of N configurations that need to be executed on PLA. N is a number greater than or equal to 1. Bank processing variable tracks if logic has been processed for configuration I. Variable bank0_processed tracks if configuration bank-0 has been used for logic processing. Initially, bank0_processed is set to true. It is set to false, once configuration bank0 has been loaded with a valid configuration. Variable bank1_processed tracks if configuration bank-1 has been used for logic processing. Initially, bank1_processed is set to true. It is set to false, once bank1 has been loaded with a valid configuration. Bank loaded variable tracks if the configuration memory bank has been loaded with a valid configuration memory bank. Variable bank0_loaded is initialized to false and set to true if bank0 has been loaded with a configuration memory. Variable bank1_loaded is initialized to false and set to true if bank1 has been loaded with a configuration memory. After these initializations, an execution event is started in 1010 initialization block.

Furthermore in FIG. 10, 1020 illustrates a flowchart for configuration RAM loading. The configuration loader waits in 1021 until execution start event is received. In 1022, it first checks if bank0_processed is true. If it is false, it waits for a user defined K cycles in 1023, and goes back to 1022. Thus, it remains in 1022 until bank0_processed is true. Once bank0_processed is true, bank0 now can be loaded with configuration I if I is less than N. In 1024, if variable I is not less than N, and then all configuration blocks have been executed. It stops execution by issuing stop event in 1011. If variable I is less than N, block 1025 loads configuration I in bank-0. Variable bank0_loaded is set to true to indicate that bank0 is ready for execution. Variable bank0_processed in set to false. After loading bank0, block 1026 checks if bank1_processed is true. If bank1_processed in false, 1027 waits for user defined K cycles. It then waits in 1026, until bank1_processed is true. When it is true, block 1028 checks if variable I is less than total configuration N. If variable I is greater than or equal to N, a stop event is issued in 1011. If variable I is less than N, configuration I is loaded in bank1. Variable bank1_loaded is set to true, and bank1_processed is set to false. It then transitions to 1021, to wait for loading configuration memory into bank0. It repeats the steps of FIG. 10 flowchart until stop event 1011 is issued.

FIG. 10*a* illustrates a data processing flow chart for programmable logic accelerator. Data execution unit waits in 1041 until execution start event is received. Once execution start event is received, in 1042 it checks if bank0 has been loaded. If variable bank0_loaded is not true, it waits for user defined K cycles in 1044. It waits in 1042 until bank0 has been loaded with valid configuration value. Once bank0_loaded in true, block 1044 executes logic for configuration I. Once logic is executed, bank0_processed is set to true, and bank0_loaded is set to false. It also increments configuration I by 1. In 1045, it checks if configuration I is less than N. If it is not, all execution is completed, and a stop event is issued in 1011. If I<N, block 1046 checks if variable bank1_loaded is true. If it is not loaded, it waits for user defined K cycles in 1047, and then waits in 1046. If variable bank1_loaded is true, block 1048 executes logic for configuration I. Once logic is executed, bank1_processed is set to true, and bank1_loaded is set to false. It also increments configuration I by 1. In 1049, it checks if configuration I is less than N. If it is not, all execution is completed, and a stop event is issued in 1011. If I<N, the execution engine goes to block 1042 to execute next configuration value. The execution engine keeps running until a stop event 1011 is issued.

FIGS. 10 and 10*a* provide a methodology using the PLA code execution that is not limited by the size of the PLA resources. SOC application software can select to run using bank0 configuration or bank1 configuration. Configuration memory blocks are high performance design blocks that execute faster than data processing logic. The configuration load time is typically less than data logic processing time. SOC software removed the configuration penalty by switching between the two configuration schemes. While data is operating using bank-0 configuration, bank-1 configuration is programmed. It is ready to execute once bank-0 logic processing is complete. Once bank-0 logic execution is complete, bank-1 logic execution starts immediately thereafter. While data is operating using bank-1 configuration, bank-0 configuration is programmed. It is ready to execute once bank-1 logic processing is complete. Once bank-1 logic execution is complete, bank-0 logic execution starts immediately thereafter. Configuration keeps switching until user code is executed fully. This configuration switching provides a flow where data operation is not blocked or slowed down due to configuration times.

One of ordinary skill in the art should recognize that FIG. 10 and FIG. 10*a* are intended as embodiments such that other variations or modifications can be practiced without departing from the spirits of the present invention e.g. number of configuration banks. The flowcharts in FIG. 10 and FIG. 10*a* work with one configuration memory. In this embodiment, in FIG. 10 block 1025 outputs feed directly into block 1022 instead of block 1016. In FIG. 10*a*, block 1025 output feed directly into block 1022 instead of block 1026. In this scheme, the configuration memory bank programming is delayed until processing is complete. Additionally, logic processing is not started until configuration bank memory is programmed.

Figure 11:
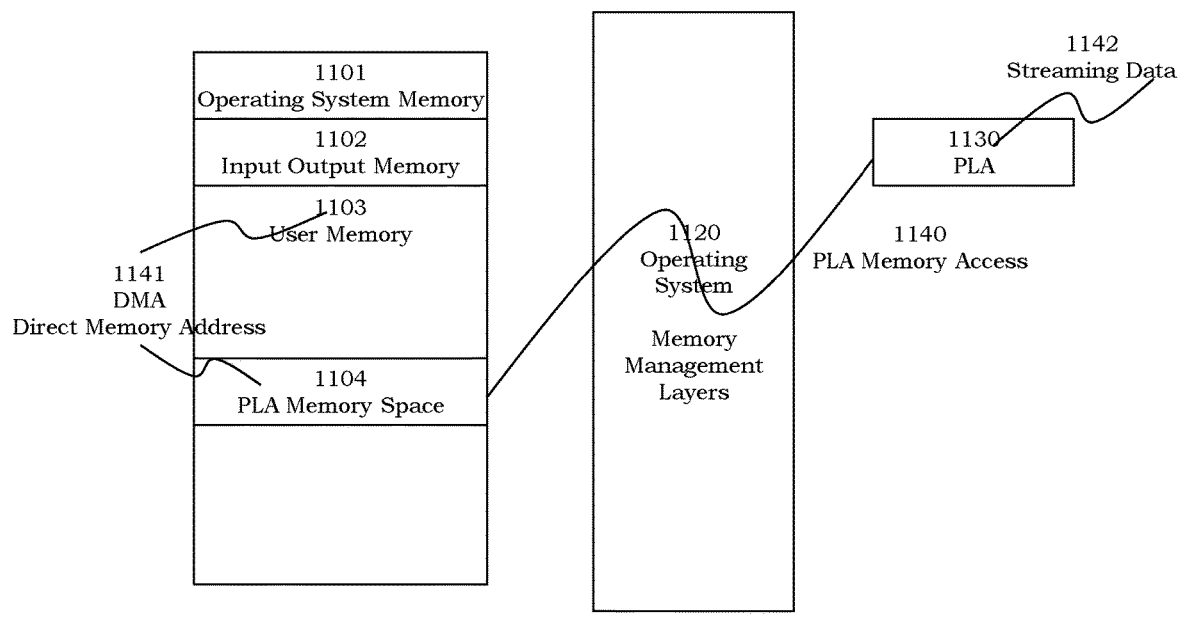
FIG. 11 is an architecture diagram illustrating a memory management by processor OS. It illustrates PLA usage of the SOC memory space.

FIG. 11 shows an architectural diagram of memory usage in SOC and PLA. In an SOC, memory space 1101 is managed by OS 1120. The OS 1120 memory space 1101 is divided into memory regions among different functionalities and SOC components. IO Memory 1102 is used by IO blocks. User memory 1103 is available for application user software applications. Memory management software in OS 1120 manages and allocates these regions. OS 1120 provides a memory space 1104 for PLA block 1130. Data and configuration memory of PLA block 1130 are obtained by reading and writing from PLA memory space 1104. User can now choose to send and receive data from PLA block 1130 using PLA memory access schemes 1140. In a Direct Memory Transfer (DMA) scheme, 1141 OS can move or share data from PLA memory space 1104 to other user memory space 1103. Data transfers to PLA block 1130 are direct memory access transfers managed by OS. In Streaming scheme 1142, data can be transferred by PLA 1130 between two different blocks without going through the OS memory management 1120. FIG. 2a illustrates such a scheme. Data is streamed directly between SOC components 253 and 251. Data and configuration memory flow for a programmable SOC with PLA can use DMA, Streaming or both of these schemes to enable SOC processing.

I claim:

1. A programmable logic accelerator having a plurality of configuration memory blocks, each configuration memory block comprising:
   a plurality of configuration memory banks, the plurality of configuration memory banks including a first configuration memory bank and a second configuration memory bank, the first configuration memory bank having one or more inputs and one or more outputs, the second configuration memory bank having one or more inputs and one or more outputs;
   programmable control logic having one or more output and one or more inputs coupled to the first and second configuration memory banks, the one or more outputs from the programmable control logic capable of coupling to the one or more inputs of the first configuration memory bank, or capable of coupling to the one of more inputs of the second configuration memory banks, depending on a bank select signal; the programmable control logic including a configuration control logic and at least one multiplexer, the at least one multiplexer having inputs coupled to the configuration control logic and an output coupled to the first configuration memory bank or coupled to the second configuration memory bank, the configuration control logic generating the bank select signal to the at least one multiplexer;
   wherein the programmable control logic programming the first configuration memory bank for configuring a programmable logic tile while the second configuration memory bank performing a first logic function, or programmable control logic programming the second configuration memory bank for configuring the programmable logic tile while the first configuration memory bank performing a second logic function, and wherein the overall performance of the programmable logic accelerator is not limited by configuration load penalty from the first and second configuration memory banks.

2. The configuration memory block of claim 1 wherein the programmable control logic programs at least one configuration memory bank from the configuration memory banks, the at least one configuration memory banks having an input for receiving instructions from a system-on-chip interface.

3. The configuration memory block of claim 1 wherein at least one configuration memory bank from the configuration memory banks is designed on system on chip using high performance application specific integrated circuit implementations.

4. An electronic design method for mapping a user design onto a plurality of configuration memory banks, the plurality of configuration memory banks having a first configuration memory bank and a second configuration memory bank, comprising:
   programming the first configuration memory bank when the second configuration memory bank is in logic use;
   programming the second configuration memory bank while the first configuration memory bank is in logic use;
   programming a control block to select the second configuration memory bank for program when the programming of the first configuration memory bank has been completed; and
   programming the control block to select the first memory configuration bank to program when the programming of the second memory bank has been completed,
   wherein the control block including a configuration control logic and at least one multiplexer, the at least one multiplexer having inputs coupled to the configuration control logic and an output coupled to the first configuration memory bank or coupled to the second configuration memory bank, the configuration control logic generating bank select signal to the at least one multiplexer.

5. A programmable logic integrated circuits having a plurality of programmable logic tiles, each programmable logic tiles having a plurality of configuration memory banks, comprising:
   a programmable memory logic having at least one input and at least one output;
   first and second configuration memory banks, the first configuration memory bank having at least one input and at least one output, the second configuration memory bank having at least one input and at least one output, the programmable memory logic sending a programming signal through at least one output to program either the first configuration memory bank or the second configuration memory bank in response to a bank select signal, thereby programming the selected configuration memory bank while performing a logic function in the other configuration memory bank, the programmable memory logic continuing to interleave the first configuration memory bank and the second configuration memory bank until the user logic is completed;
   wherein the programmable control logic including a configuration control logic and at least one multiplexer, the at least one multiplexer having inputs coupled to the configuration control logic and an output coupled to the first configuration memory bank or coupled to the second configuration memory bank, the configuration control logic generating the bank select signal to the at least one multiplexer, the overall performance of the programmable logic integrated circuit is not limited by configuration load penalty from the first and second configuration memory banks.

\* \* \* \* \*